(12) United States Patent
Sato

(10) Patent No.: US 12,549,177 B2
(45) Date of Patent: Feb. 10, 2026

(54) DRIVING CONTROL DEVICE, VEHICLE-ONBOARD POWER SUPPLY SYSTEM, AND VEHICLE

(71) Applicant: ROHM CO., LTD., Kyoto (JP)

(72) Inventor: Kiminobu Sato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 5 days.

(21) Appl. No.: 18/798,965

(22) Filed: Aug. 9, 2024

(65) Prior Publication Data

US 2024/0405770 A1   Dec. 5, 2024

Related U.S. Application Data

(63) Continuation of application No. PCT/JP2023/002639, filed on Jan. 27, 2023.

(30) Foreign Application Priority Data

Feb. 18, 2022   (JP) .................... 2022-023591

(51) Int. Cl.
*B60R 16/033*   (2006.01)
*H03K 17/687*   (2006.01)

(52) U.S. Cl.
CPC ......... *H03K 17/687* (2013.01); *B60R 16/033* (2013.01)

(58) Field of Classification Search
CPC ............... B60R 16/033; H03K 17/687
USPC .......... 327/108, 109, 365, 379, 389
See application file for complete search history.

(56) References Cited

U.S. PATENT DOCUMENTS 5,650,741 A * 7/1997 Nakamura ........... H03K 17/687
                                                  327/314
6,269,011 B1 * 7/2001 Ohshima ................ H02H 3/087
                                                  323/908
2004/0130654 A1 * 7/2004 Ryu .................... H04N 1/00907
                                                  348/371

FOREIGN PATENT DOCUMENTS

JP   2020-202714   12/2020

OTHER PUBLICATIONS

International Search Report and Written Opinion in International Appln. No. PCT/JP2023/002639, mailed on Mar. 7, 2023, 13 pages (with machine translation).

* cited by examiner

*Primary Examiner* — William Hernandez
(74) *Attorney, Agent, or Firm* — Fish & Richardson P.C.

(57) ABSTRACT

A driving control device for controlling the driving of the gate of a cut-off NMOS transistor arranged to be connectable between a first power supply circuit and a second power supply circuit includes a boost circuit configured to feed a gate control voltage to the gate and a controller configured, in start-up control for the cut-off NMOS transistor, to keep the current capacity of the boost circuit during start-up at a first current capacity and, after that, to switch the current capacity of the boost circuit to a second current capacity higher than the first current capacity.

9 Claims, 10 Drawing Sheets

US 12,549,177 B2

DRIVING CONTROL DEVICE, VEHICLE-ONBOARD POWER SUPPLY SYSTEM, AND VEHICLE

CROSS-REFERENCE TO RELATED APPLICATIONS

This nonprovisional application is a continuation application of International Patent Application No. PCT/JP2023/002639 filed on Jan. 27, 2023, which claims priority Japanese Patent Application No. 2022-023591 filed on Feb. 18, 2022, the entire contents of which are hereby incorporated by reference.

TECHNICAL FIELD

The present disclosure relates to a driving control device.

BACKGROUND ART

Some known power supply devices, in particular those for vehicle onboard use, include a primary power supply circuit that bucks an input voltage to a predetermined output voltage and a secondary power supply circuit that is fed with the output voltage from the primary power supply circuit (for example, Patent Document 1).

CITATION LIST

Patent Literature

Patent Document 1: Japanese Unexamined Patent Application Publication No. 2020-202714

DESCRIPTION OF EMBODIMENTS

Hereinafter, an illustrative embodiment of the present disclosure will be described with reference to the drawings.

1. Configuration of Vehicle-Onboard Supply System

Figure 1:
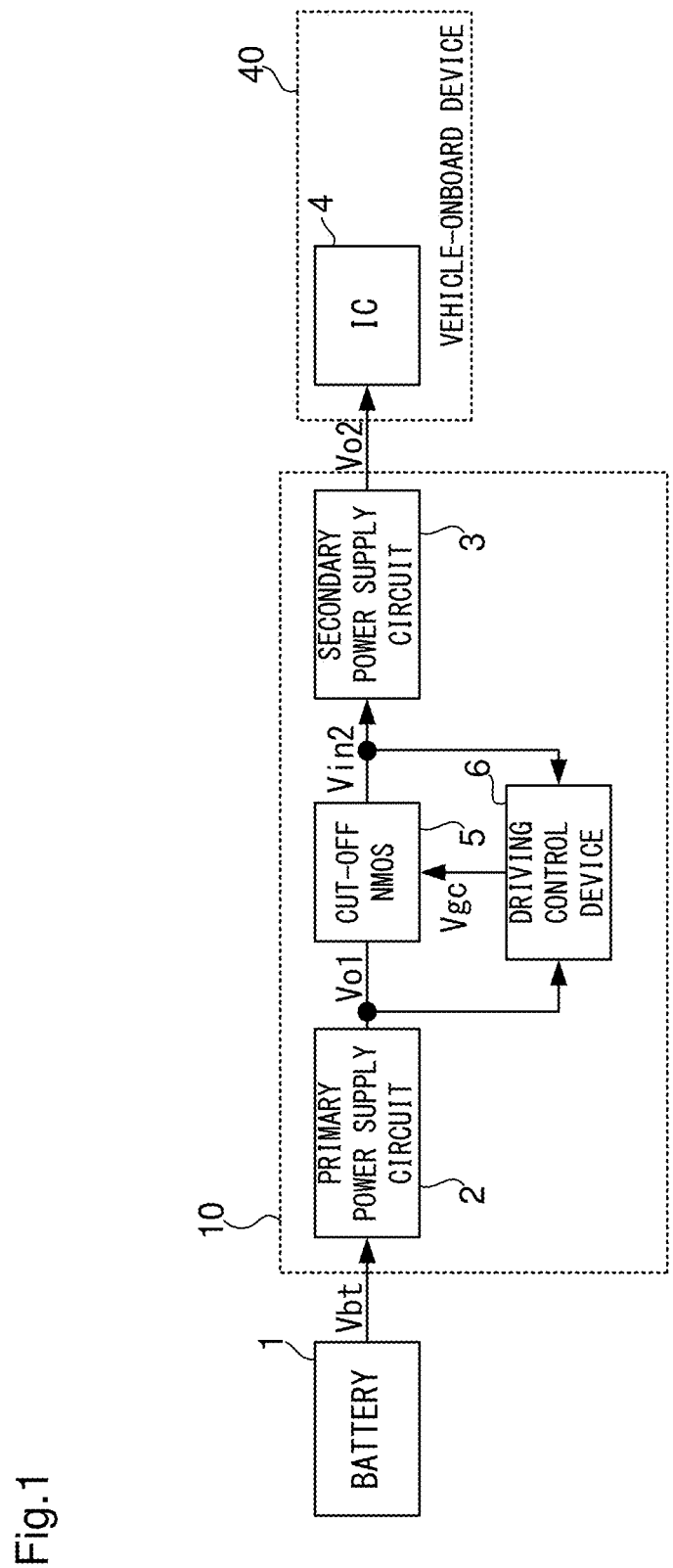
FIG. 1 is a block diagram showing the configuration of a vehicle-onboard power supply system.

FIG. 1 is a block diagram showing the configuration of a vehicle-onboard power supply system 10. As shown in FIG. 1, a battery 1, the vehicle-onboard power supply system 10, and a vehicle-onboard device 4 are incorporated in a vehicle. The power supply system according to the present disclosure is not limited to vehicle-onboard use.

The vehicle-onboard system 10 includes a primary power supply circuit 2, a secondary power supply circuit 3, a cut-off NMOS transistor 5, and a driving control device 6.

The input terminal of the primary power supply circuit 2 is connected to the output terminal of the battery 1. A battery voltage Vbt output from the output terminal of the battery 1 is input to the input terminal of the primary power supply circuit 2. The battery voltage Vbt is, for example, 12 V. The primary power supply circuit 2 bucks the battery voltage Vbt and outputs an output voltage Vo1 from the output terminal of the primary power supply circuit 2. The primary power supply circuit 2 is configured as, for example, a switching power supply circuit. The output voltage Vo1 is, for example, 5V.

The output terminal of the primary power supply circuit 2 is connected to the input terminal of the secondary power supply circuit 3 via the cut-off NMOS transistor 5, which will be described later. The output voltage Vo1 output from the primary power supply circuit 2 is input, as an input voltage Vin2, to the input terminal of the secondary power supply circuit 3 via the cut-off NMOS transistor 5. The secondary power supply circuit 3 bucks the input voltage Vin2 and outputs an output voltage Vo2 from the output terminal of the secondary power supply circuit 3. The secondary power supply circuit 3 is configured as, for example, a LDO (low-dropout) type. The output voltage Vo2 is, for example, 1.2 V.

An IC (integrated circuit) 4 is included in a vehicle-onboard device 40. The IC 4 is fed with the output voltage Vo2 from the secondary power supply circuit 3.

The secondary power supply circuit 3 has a low withstand voltage, and this necessitates conversion by the primary power supply circuit 2 into the lower output voltage Vo1. However, if a fault occurs in the primary power supply circuit 2 and the battery voltage Vbt is fed to the secondary power supply circuit 3, the secondary power supply circuit 3 and the IC 4 in the succeeding stage may be adversely affected.

To cope with that, the vehicle-onboard power supply system 10 is provided with the cut-off NMOS transistor 5 and the driving control device 6. The cut-off NMOS transistor 5 is configured as an N-channel MOSFET (metal-oxide-semiconductor field-effect transistor). The cut-off NMOS transistor 5 is connected between the output terminal of the primary power supply circuit 2 and the input terminal of the secondary power supply circuit 3.

The driving control device 6 is configured to control the driving of the gate of the cut-off NMOS transistor 5. The driving control device 6 feeds a gate control voltage Vgc to the gate of the cut-off NMOS transistor 5 to drive the gate. Thus, the driving control device 6 can turn on and off the cut-off NMOS transistor 5.

The cut-off NMOS transistor 5 is configured as an N-channel MOSFET, so the gate control voltage Vgc needs to be higher than the output voltage Vo1 output from the primary power supply circuit 2. Thus, the driving control device 6 includes a boost circuit (not shown in FIG. 1) that boosts the output voltage Vo1 to convert it into the gate control voltage Vgc.

The driving control device 6, when it detects a fault in the input voltage Vin2 input to the input terminal of the secondary power supply circuit 3, switches the cut-off NMOS transistor 5 from on to off to cut off the power supply path between the primary power supply circuit 2 and the secondary power supply circuit 3. In this way, the secondary power supply circuit 3 and the IC 4 can be protected.

2. Drawback in Start-Up Control of Cut-Off NMOS Transistor

At start-up, the driving control device 6 raises from 0 V the gate control voltage Vgc for driving the gate of the cut-off NMOS transistor 5. Meanwhile, if the rise is steep, when the cut-off NMOS transistor 5 turns on (switches from off to on) a rush current may flow via the cut-off NMOS transistor 5 into an input capacitor included in the secondary power supply circuit 3. If the rush current occurs, it may induce faulty operation of the primary power supply circuit 2.

To prevent the rush current, it is necessary to perform soft starting by gently raising the gate control voltage Vgc. Here, the driving control device 6 can perform soft starting by feeding back the input voltage Vin2 and performing feedback control on the gate control voltage Vgc. However, the current capacity changes depending on the current consumption by the secondary power supply circuit 3 and the IC 4, so the size and the type of the cut-off NMOS transistor 5 are not fixed. Thus, it is difficult to perform soft starting by feedback control as described above.

Figure 2:
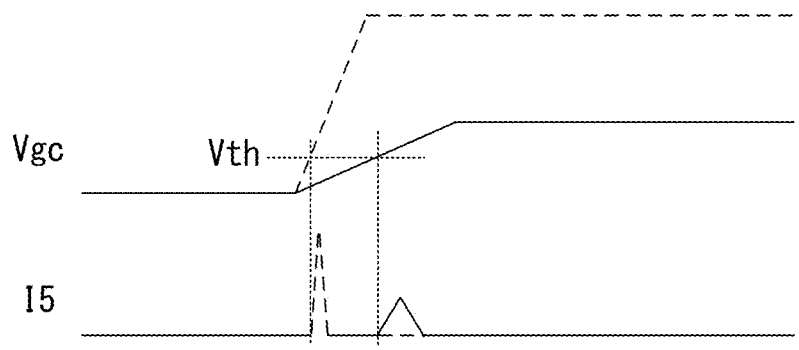
FIG. 2 is a diagram showing an example of waveforms in start-up control according to a reference example.

In view of the foregoing, to perform soft starting regardless of the size and the type of the cut-off NMOS transistor 5 and to prevent a rush current in a way that suits the cut-off NMOS transistor 5 with a low gate capacity, the current capacity of the boost circuit provided in the driving control device 6 can be reduced. An example of waveforms in start-up control in that case is shown in FIG. 2. FIG. 2 shows the waveforms of the gate control voltage Vgc and the current 15 flowing through the cut-off NMOS transistor 5.

As indicated with a solid line in FIG. 2, if the gate control voltage Vgc is gently raised from 0 V, the cut-off NMOS transistor 5 turns on when the gate control voltage Vgc rises above a threshold voltage Vth, but a rush current in the current 15 is prevented. The broken lines in FIG. 2 indicate the waveforms observed with no soft starting performed (with a high current capacity in the boost circuit), so the rush current is occurred in the current 15.

One drawback of performing soft starting as described above is that, as shown in FIG. 2, the steady-state voltage (the boost voltage after start-up) after the gate control voltage Vgc has risen is too low to make full use of the on resistance characteristics of the cut-off NMOS transistor 5.

As a remedy to the above drawback, the embodiment of the present disclosure described below aims at both preventing the rush current at start-up and making better use of the on resistance characteristics of the cut-off NMOS transistor 5 after start-up.

3. First Embodiment

Figure 3:
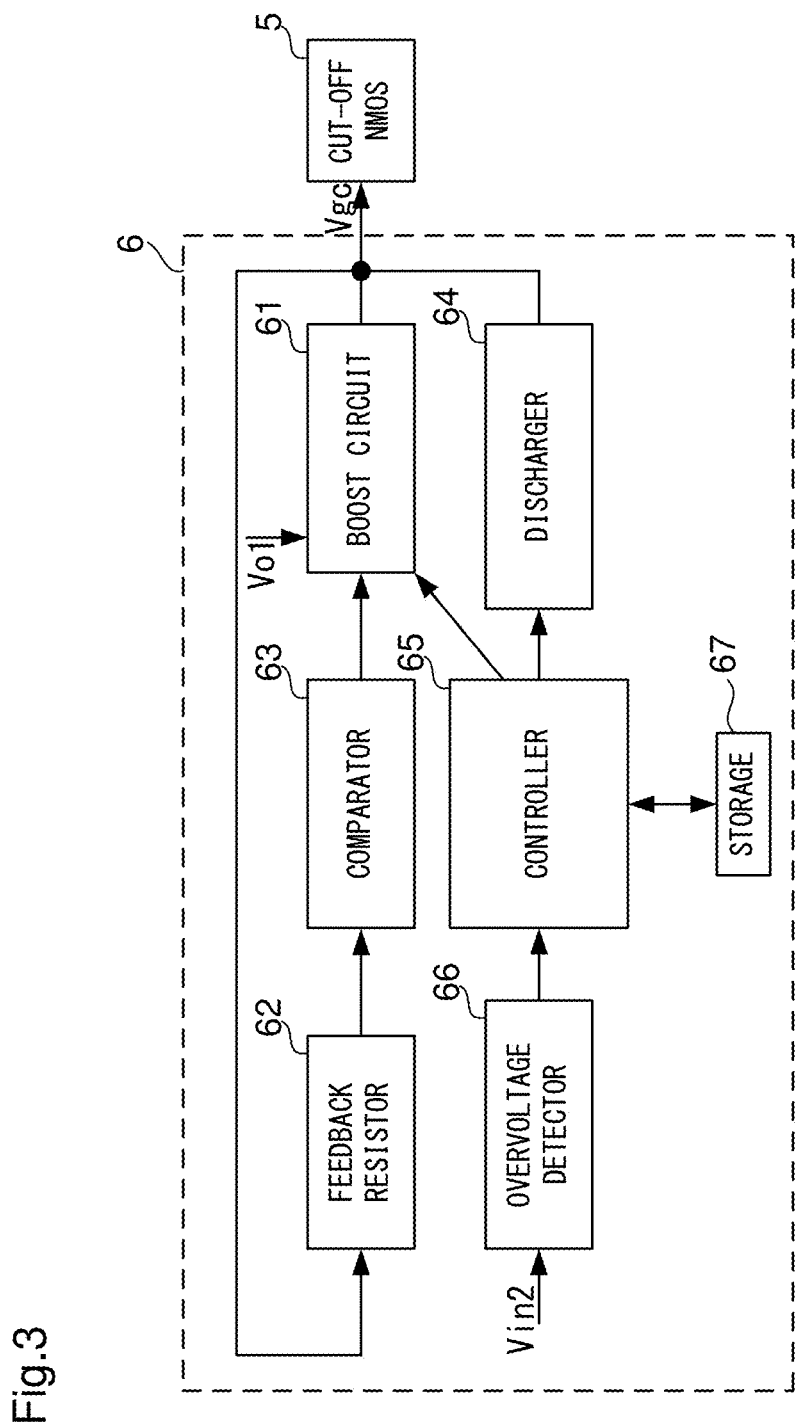
FIG. 3 is a block diagram showing the configuration of a driving control device according to a first embodiment.

FIG. 3 is a block diagram showing the configuration of a driving control device 6 according to a first embodiment. The driving control device 6 shown in FIG. 3 has a boost circuit 61, a feedback resistor 62, a comparator 63, a discharger 64, a controller 65, an overvoltage detector 66, and a storage 67.

Figure 4:
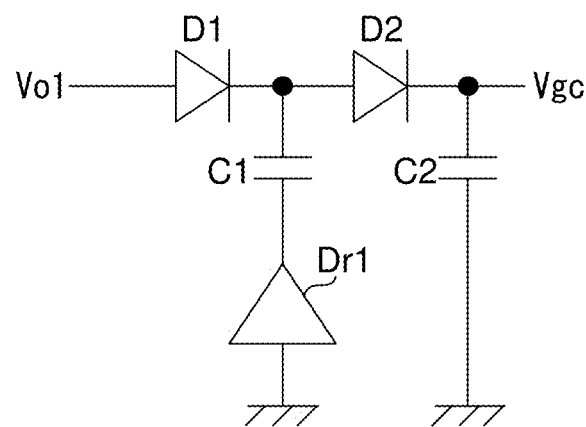
FIG. 4 is a diagram showing an example of the configuration of a boost circuit.

The boost circuit 61 boosts the output voltage Vo1 output from the primary power supply circuit 2 (see FIG. 1) to convert it into the gate control voltage Vgc and feeds this to the gate of the cut-off NMOS transistor 5. The boost circuit 61 is configured as, for example, a charge pump as shown in FIG. 4. The boost circuit 61 shown in FIG. 4 has diodes D1 and D2, capacitors C1 and C2, and a driver Dr1. To the anode of the diode D1, an application terminal for the output voltage Vo1 is connected. To a node at which the cathode of the diode D1 and the anode of the diode D2 are connected together, one terminal of the capacitor C1 is connected. The other terminal of the capacitor C1 is connected to the driver Dr1. The cathode of the diode D2 is connected to one terminal of the capacitor C2. The other terminal of the capacitor C2 is connected to an application terminal for a ground potential. The driver Dr1 outputs, while switching between, 0 V and a predetermined driving voltage so that, at one terminal of the capacitor C2, a voltage that is the sum of the output voltage Vo1 and the just-mentioned predetermined driving voltage is generated as the gate control voltage Vgc. For example, if the output voltage Vo1 equals 5 V, the predetermined driving voltage above equals 5 V, and the forward bias of the diodes D1 and D2 equals Vf, then the gate control voltage Vgc equals 10 V−2 Vf.

The feedback resistor 62 is a resistor that divides the gate control voltage Vgc output from the boost circuit 61. The comparator 63 compares the voltage resulting from voltage division by the feedback resistor 62 with a predetermined reference voltage and outputs the result of the comparison to the boost circuit 61. The boost circuit 61 is stopped when the voltage resulting from voltage division rises above the reference voltage. Thus, the gate control voltage Vgc is stably controlled.

The discharger 64 is a circuit that discharges electric charge from the gate of the cut-off NMOS transistor 5. The controller 65 controls different parts of the driving control device 6. The overvoltage detector 66 is configured to detect an overvoltage in the input voltage Vin2. When the overvoltage detector 66 detects an overvoltage in the input voltage Vin2, the controller 65 instructs the discharger 64 to discharge electric charge from the gate of the cut-off NMOS transistor 5. In this way, the cut-off NMOS transistor 5 is turned off (switched from on to off) to cut off the power supply path.

In the storage 67, parameters related to start-up control are stored as will be described later.

Figure 5:
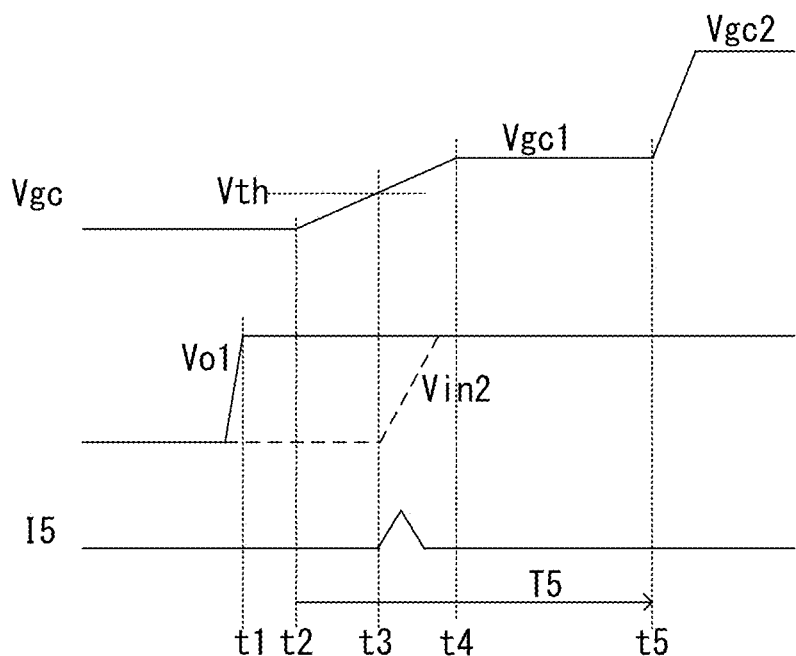
FIG. 5 is a diagram showing an example of waveforms in start-up control according to the first embodiment.

Start-up control for the cut-off NMOS transistor 5 by the driving control device 6 according to the first embodiment will be described with reference to FIG. 5. FIG. 5 is a diagram showing an example of the waveforms in start-up control according to the first embodiment. FIG. 5 shows, from top down, the gate control voltage Vgc, the output voltage Vo1, the input voltage Vin2, and the current 15 flowing through the cut-off NMOS transistor 5. The same applies to FIGS. 7 to 9, which will be referred to later.

As shown in FIG. 5, the primary power supply circuit 2 starts up at timing t1 and the output voltage Vo1 starts to rise from 0 V. After that, at timing t2, the boost circuit 61 starts up and the gate of the cut-off NMOS transistor 5 starts to be charged and then the gate control voltage Vgc starts to rise from 0 V. Here, the controller 65 keeps the current capacity of the boost circuit 61 low.

The current capacity of the boost circuit 61 can be adjusted by, for example, if with a charge pump as shown in FIG. 4, changing the driving frequency of the charge pump. In the configuration shown in FIG. 4, the driving frequency of the charge pump is the frequency at which the output is switched by the driver Dr1. The higher the driving frequency, the higher the current capacity.

Since the boost circuit 61 has a low current capacity, the gate control voltage Vgc gently rises from timing t2 and soft starting is performed. When the gate control voltage Vgc rises above the threshold voltage Vth at timing t3, the cut-off NMOS transistor 5 turns on and the current 15 flows. Here, the just-mentioned soft starting prevents a rush current in the current 15.

At timing t4, the gate control voltage Vgc becomes equal to the steady-state voltage Vgc1 and stabilizes. After that, at timing t5, the controller 65 switches to increase the current capacity of the boost circuit 61. Here, the controller 65 counts the lapse time from timing t2 and at timing t5, that is, at the lapse of a predetermined lapse time T5, switches the current capacity as mentioned above. Then the gate control voltage Vgc rises sharply and stabilizes at a steady-state voltage Vgc2.

Thus, with this embodiment, at the start-up of the cut-off NMOS transistor 5, the current capacity of the boost circuit 61 is kept low and after that, to increase the current capacity of the boost circuit 61, while soft starting prevents a rush current, the gate control voltage Vgc after start-up can be raised to the steady-state voltage Vgc2; it is thus possible to make full use of the on resistance characteristics of the cut-off NMOS transistor 5 after start-up. With this embodiment, the current capacity is switched according to the lapse time and this makes it easy to raise the gate control voltage Vgc to the steady-state voltage Vgc2 after it has reached the steady-state voltage Vgc1 and stabilized.

The predetermined lapse time T5 mentioned above is stored as a parameter in the storage 67. Here, depending on the cut-off NMOS transistor 5 used, the time required for the gate control voltage Vgc to rise to the steady-state voltage Vgc1 differs, so a predetermined lapse time corresponding to the cut-off NMOS transistor 5 expected to be used may be stored in the storage 67.

Alternatively, in the cut-off NMOS transistor 5 expected to be used, a predetermined lapse time longer than the longest time required for the gate control voltage Vgc to rise to the steady-state voltage Vgc1 may be stored in the storage 67.

4. Second Embodiment

Figure 6:
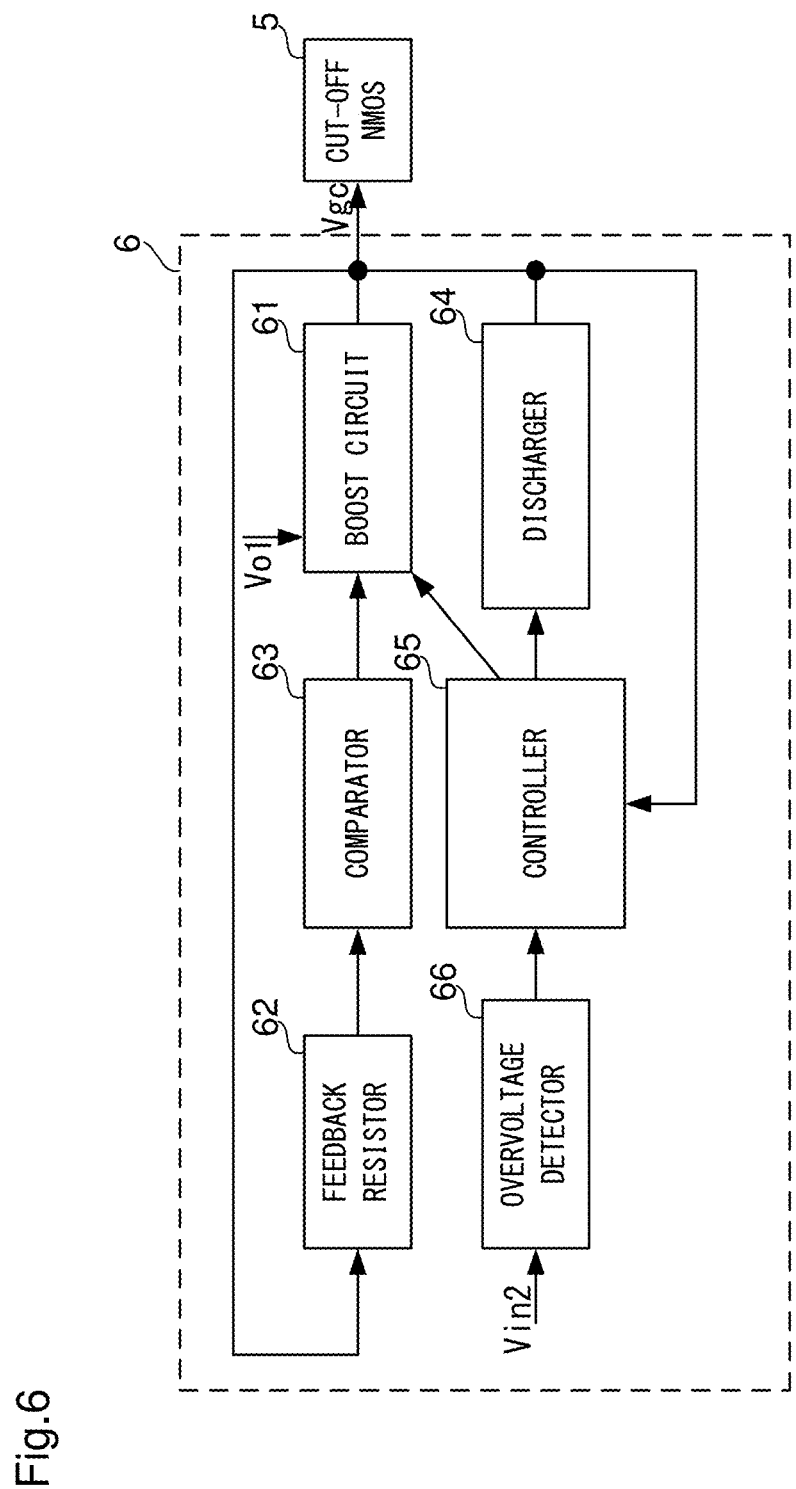
FIG. 6 is a block diagram showing the configuration of a driving control device according to a second embodiment.

FIG. 6 is a block diagram showing the configuration of a driving control device 6 according to a second embodiment. The configuration of the driving control device 6 shown in FIG. 6, unlike that of the first embodiment (see FIG. 3), does not require the storage 67. On the other hand, the controller 65 is configured to be able to monitor the gate control voltage Vgc.

Figure 7:
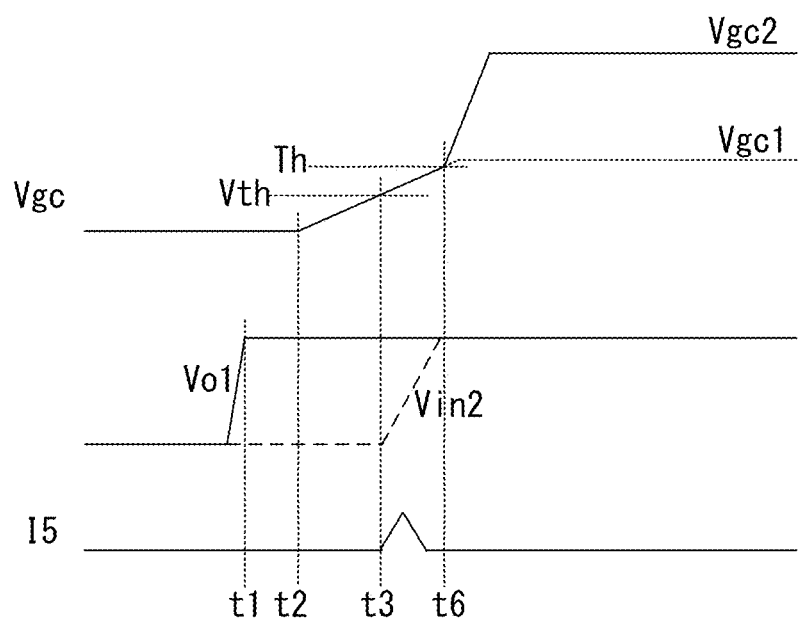
FIG. 7 is a diagram showing an example of waveforms in start-up control according to the second embodiment.

Start-up control for the cut-off NMOS transistor 5 by the driving control device 6 according to the embodiment shown in FIG. 6 will be described with reference to FIG. 7. FIG. 7 is a diagram showing an example of the waveforms in start-up control according to the second embodiment.

The control shown in FIG. 7 is similar to that in the first embodiment (see FIG. 5) until timing t3. The controller 65 monitors the gate control voltage Vgc and, on sensing that the gate control voltage Vgc has reached a predetermined switching threshold voltage Th (timing t6), switches to increase the current capacity of the boost circuit 61. Thus, from timing t6, the gate control voltage Vgc rises sharply and stabilizes at the steady-state voltage Vgc2. The switching threshold voltage Th is set higher than the threshold voltage Vth.

Also with this embodiment, it is possible to both to prevent a rush current by performing soft starting and to make better use of the on resistance characteristics of the cut-off NMOS transistor 5 after start-up. In addition, this embodiment does not require a storage to store a lapse time as in the first embodiment.

5. Third Embodiment

Figure 8:
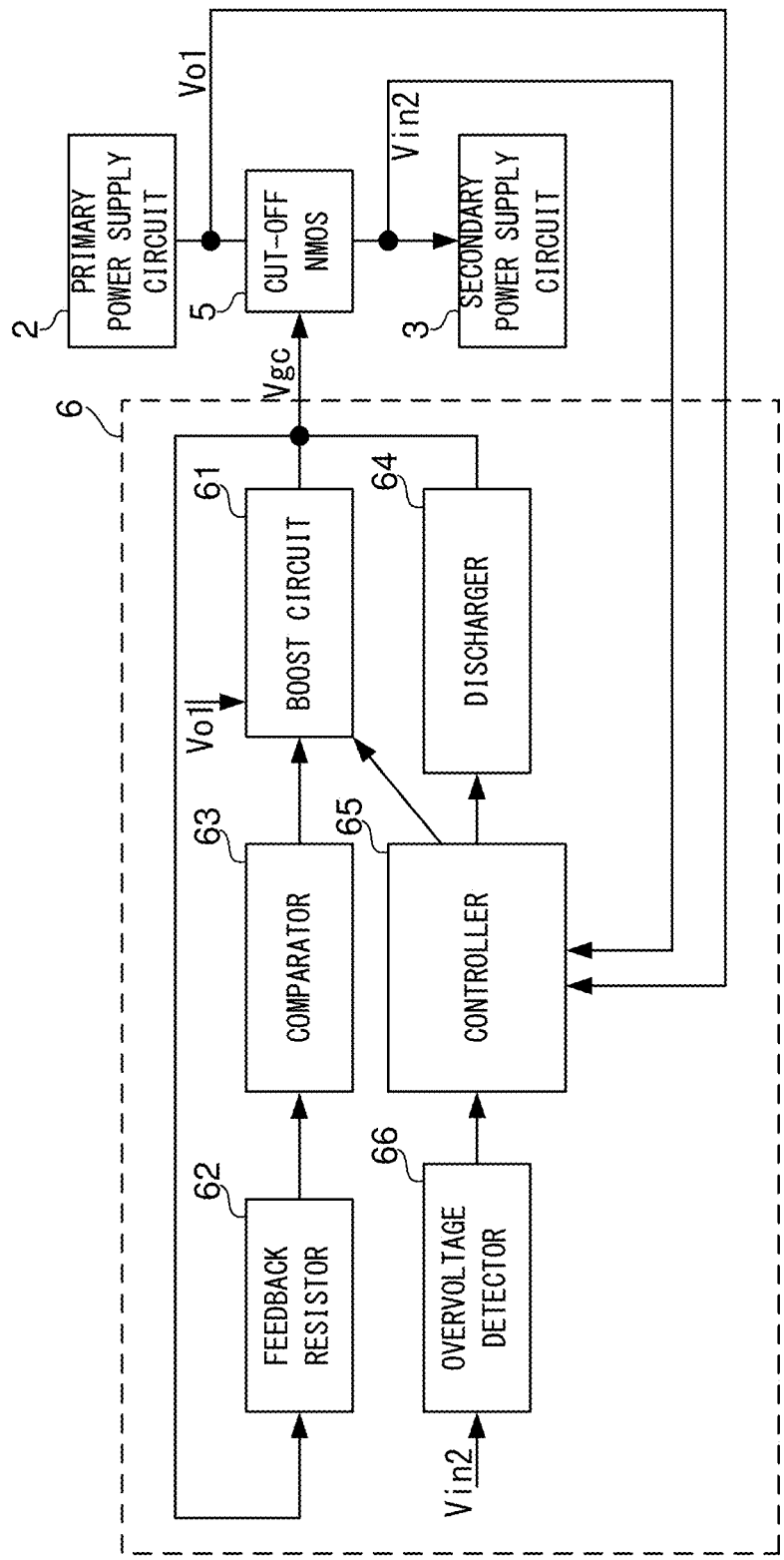
FIG. 8 is a block diagram showing the configuration of a driving control device according to a third embodiment.

FIG. 8 is a block diagram showing the configuration of a driving control device 6 according to a third embodiment. The configuration of the driving control device 6 shown in FIG. 8, unlike that of the first embodiment (see FIG. 3), does not require the storage 67. On the other hand, the controller 65 is configured to be able to monitor the output voltage Vo1 output from the primary power supply circuit 2 and the input voltage Vin2 input to the secondary power supply circuit 3.

Figure 9:
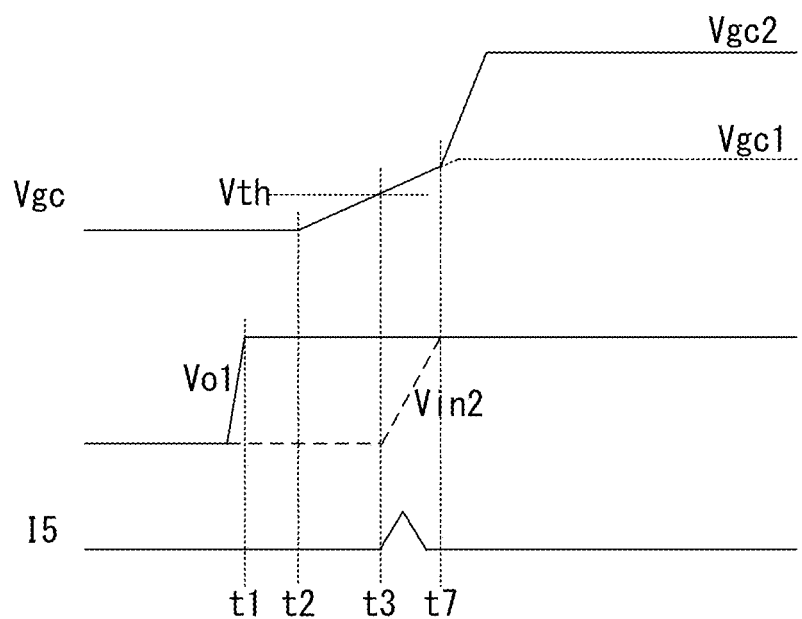
FIG. 9 is a diagram showing an example of waveforms in start-up control according to the third embodiment.

Start-up control for the cut-off NMOS transistor 5 by the driving control device 6 according to the embodiment shown in FIG. 8 will be described with reference to FIG. 9. FIG. 9 is a diagram showing an example of the waveforms in start-up control according to the third embodiment.

The control shown in FIG. 7 is similar to that in the first embodiment (see FIG. 5) until timing t3. The controller 65 monitors the output voltage Vo1 and the input voltage Vin2. At timing t3, the cut-off NMOS transistor 5 turns on and thus the input voltage Vin2 starts to rise. Then, the controller 65, on sensing that the input voltage Vin2 has reached the output voltage Vo1 (timing t7), switches to increase the current capacity of the boost circuit 61. Thus, from timing t7, the gate control voltage Vgc rises sharply and stabilizes at the steady-state voltage Vgc2.

Also with this configuration, it is possible both to prevent a rush current by performing soft starting and to make better use of the on resistance characteristics of the cut-off NMOS transistor 5 after start-up. In addition, with this embodiment, it is not necessary to set a lapse time as in the first embodiment or a switching threshold voltage Th as in the second embodiment.

6. Application to Vehicles

Figure 10:
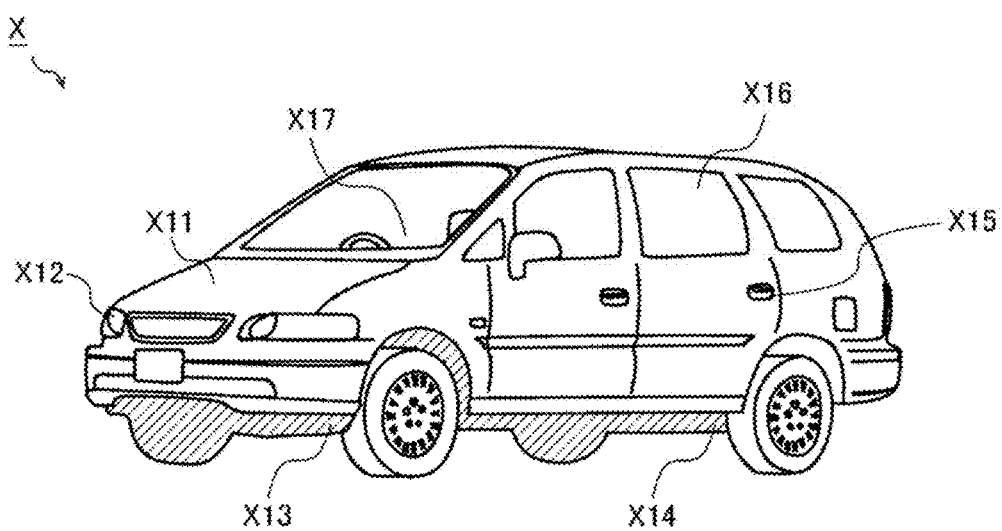
FIG. 10 is an exterior view of one configuration example of a vehicle.

FIG. 10 is an exterior view of one configuration example of a vehicle incorporating the battery 1, the vehicle-onboard power supply system 10, and the vehicle-onboard device 40 described previously. FIG. 10 shows, as examples of the vehicle-onboard device 40, vehicle-onboard devices X11 to X17 incorporated in the vehicle X.

The vehicle-onboard device X11 is an engine control unit that performs control related to an engine (such as injection control, electronic throttle control, idling control, oxygen sensor heater control, and automatic cruise control).

The vehicle-onboard device X12 is a lamp control unit that controls the lighting and extinguishing of HIDs (high-intensity discharged lamps), DRLs (daytime running lamps), and the like.

The vehicle-onboard device X13 is a transmission control unit that performs control related to a transmission.

The vehicle-onboard device X14 is a body control unit that performs control related to the movement of the vehicle X (such as ABS [anti-lock brake system] control, EPS [electric power steering] control, and electronic suspension control).

The vehicle-onboard device X15 is a security control unit that drives and controls door locks, burglar alarms, and the like.

The vehicle-onboard device X16 comprises electronic devices installed in the vehicle X as standard or manufacturer-fitted equipment at the stage of factory shipment, such as wipers, power door mirrors, power windows, power sun roofs, power seats, and air conditioners.

The vehicle-onboard device X17 comprises electronic devices optionally attached to the vehicle X as user-fitted equipment, such as vehicle-onboard A/V (audio visual) devices, car navigation systems, and an ETC (electronic toll collection system).

7. Others

The various technical features disclosed herein can be implemented in any manners other than as in the above-described embodiments with any modifications made without departure from the spirit of their technical ingenuity. That is, it should be understood that the above-described embodiments are in every aspect illustrative and not restrictive. The technical scope of the present disclosure is defined not by the description of the embodiments given above but by the appended claims, and encompasses any modifications made within a scope equivalent in significance to those claims.

8. Notes

As described above, for example, according to one aspect of the present disclosure, a driving control device (6) for controlling the driving of the gate of a cut-off NMOS transistor (5) arranged to be connectable between a first power supply circuit (2) and a second power supply circuit (3) includes a boost circuit (61) configured to feed a gate control voltage (Vgc) to the gate and a controller (65) configured, in start-up control for the cut-off NMOS transistor, to keep the current capacity of the boost circuit during start-up at a first current capacity and, after that, to switch the current capacity of the boost circuit to a second current capacity higher than the first current capacity. (A first configuration.)

In the first configuration described above, the controller (65) may be configured to switch the first current capacity to the second current capacity at a timing based on a lapse time. (A second configuration; a first embodiment.)

The second configuration described above may further include a storage (67) configured to store the lapse time corresponding to the cut-off NMOS transistor (5) expected to be used. (A third configuration; FIG. 3.)

The second configuration described above may further include a storage (67) configured to store the lapse time longer than the longest time required, in the cut-off NMOS transistor (5) expected to be used, for the gate control voltage (Vgc) to rise to a steady-state voltage (Vgc1). (A fourth configuration.)

In the first configuration described above, the controller (65) may be configured, on sensing that the gate control voltage (Vgc) has reached a predetermined switching threshold voltage (Th), to switch the first current capacity to the second current capacity, and the switching threshold voltage may be higher than the threshold voltage (Vth) at which the cut-off NMOS transistor (5) turns on. (A fifth configuration; a second embodiment.)

In the first configuration described above, the controller (65) may be configured, on sensing that an input voltage (Vin2) to the second power supply circuit (3) has reached the output voltage (Vo1) of the first power supply circuit (2), to switch the first current capacity to the second current capacity. (A sixth configuration; a third embodiment.)

In any one of the first to sixth configurations described above, the boost circuit (61) may be configured as a charge pump, and the controller (65) may be configured to switch between the first current capacity and the second current capacity by controlling the driving frequency of the charge pump. (A seventh configuration; FIG. 4.)

According to another aspect of the present disclosure, a vehicle-onboard power supply system (10) includes the driving control device (6) according to any one of the first to seventh configurations described above, the first power supply circuit (2), the second power supply circuit (3), and the cut-off NMOS transistor (5). (An eighth configuration; FIG. 1)

According to yet another aspect of the present disclosure, a vehicle (X) includes the vehicle-onboard power supply system (10) according to the eighth configuration described above, a battery (1) configured to feed a battery voltage (Vbt) to the first power supply circuit (2), and a vehicle-onboard device (40) configured to be fed with an output voltage (Vo2) output from the second power supply circuit (3). (A ninth configuration; FIGS. 1 and 10.)

INDUSTRIAL APPLICABILITY

The present disclosure finds applications in, for example, vehicle-onboard power supply systems.

REFERENCE SIGNS LIST 1 battery
2 primary power supply circuit
3 secondary power supply circuit
4 vehicle-onboard device
5 cut-off NMOS transistor
6 driving control device
10 vehicle-onboard power supply system
40 vehicle-onboard device
61 boost circuit
62 feedback resistor
63 comparator
64 discharger
65 controller
66 overvoltage detector
67 storage
C1, C2 capacitor
D1, D2 diode
Dr1 driver
X vehicle
X11-X17 vehicle-onboard device

The invention claimed is:

1. A driving control device for controlling driving of a gate of a cut-off NMOS transistor arranged to be connectable between a first power supply circuit and a second power supply circuit, the driving control device comprising:
    a boost circuit configured to feed a gate control voltage to the gate; and
    a controller configured, in start-up control for the cut-off NMOS transistor, to keep a current capacity of the boost circuit during start-up at a first current capacity and, after that, to switch the current capacity of the boost circuit to a second current capacity higher than the first current capacity.

2. The driving control device according to claim 1, wherein
    the controller is configured to switch the first current capacity to the second current capacity at a timing based on a lapse time.

3. The driving control device according to claim 2, further comprising:

a storage configured to store the lapse time corresponding to the cut-off NMOS transistor expected to be used.

4. The driving control device according to claim 2, further comprising a storage configured to store the lapse time longer than a longest time required, in the cut-off NMOS transistor expected to be used, for the gate control voltage to rise to a steady-state voltage.

5. The driving control device according to claim 1, wherein the controller is configured, on sensing that the gate control voltage has reached a predetermined switching threshold voltage, to switch the first current capacity to the second current capacity, and the switching threshold voltage is higher than a threshold voltage at which the cut-off NMOS transistor turns on.

6. The driving control device according to claim 1, wherein the controller is configured, on sensing that an input voltage to the second power supply circuit has reached an output voltage of the first power supply circuit, to switch the first current capacity to the second current capacity.

7. The driving control device according to claim 1, wherein the boost circuit is configured as a charge pump, and the controller is configured to switch between the first current capacity and the second current capacity by controlling a driving frequency of the charge pump.

8. A vehicle-onboard power supply system comprising:

the driving control device according to claim 1;

the first power supply circuit;

the second power supply circuit; and the cut-off NMOS transistor.

9. A vehicle comprising:

the vehicle-onboard power supply system according to claim 8;

a battery configured to feed a battery voltage to the first power supply circuit; and a vehicle-onboard device configured to be fed with an output voltage output from the second power supply circuit.

\* \* \* \* \*